(12) United States Patent
Zhang et al.

(10) Patent No.: US 12,413,245 B2
(45) Date of Patent: Sep. 9, 2025

(54) MAXIMUM A POSTERIORI DETECTOR FOR LINEAR AND NONLINEAR CHANNEL IMPAIRMENT

(71) Applicant: Cisco Technology, Inc., San Jose, CA (US)

(72) Inventors: Hongbin Zhang, Holmdel, NJ (US); Murat Azizoglu, Maynard, NJ (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 18/600,681

(22) Filed: Mar. 9, 2024

(65) Prior Publication Data

US 2024/0313804 A1 Sep. 19, 2024

Related U.S. Application Data

(60) Provisional application No. 63/576,443, filed on Mar. 16, 2023.

(51) Int. Cl.
*H03M 13/00* (2006.01)
*H03M 13/11* (2006.01)
*H03M 13/39* (2006.01)

(52) U.S. Cl.
CPC ... *H03M 13/1108* (2013.01); *H03M 13/3927* (2013.01)

(58) Field of Classification Search
None
See application file for complete search history.

(56) References Cited

U.S. PATENT DOCUMENTS

| | | | | |
|---|---|---|---|---|
| 8,045,652 B1* | 10/2011 | Bitran | | H04L 5/0023 |
| | | | | 375/340 |
| 8,166,379 B1* | 4/2012 | Wu | | H03M 13/3723 |
| | | | | 714/794 |
| 9,397,701 B1* | 7/2016 | Micheloni | | H03M 13/612 |
| 2008/0292029 A1* | 11/2008 | Koslov | | H04L 27/227 |
| | | | | 375/341 |
| 2013/0176778 A1* | 7/2013 | Chen | | G11C 16/06 |
| | | | | 365/185.03 |
| 2015/0095736 A1* | 4/2015 | Leem | | G06F 11/1012 |
| | | | | 714/773 |

* cited by examiner

*Primary Examiner* — Mujtaba M Chaudry
(74) *Attorney, Agent, or Firm* — Patterson + Sheridan, LLP

(57) ABSTRACT

A receiver configured to receive a plurality of symbols is disclosed. The receiver includes a hard decision decoder, a look-up table (LUT) coupled to the hard decision decoder, and a soft metric generator coupled to the LUT. The hard decision decoder is to receive a first set of symbols from the plurality of symbols and provide a set of hard coded neighboring symbols to the LUT. The first set of symbols comprises a center symbol with neighboring symbols. The LUT is to store a value representative of the center symbol that is addressable by the set of hard coded neighboring symbols. The soft metric generator is to calculate bit log likelihood ratio (LLR) values based on the center symbol and the value representative of the center symbol stored in the LUT.

20 Claims, 9 Drawing Sheets

| | 302 | | | 306 | 308 | 310 | 312 |
|---|---|---|---|---|---|---|---|
| x1 | x2 | x4 | x5 | D-3 | D-1 | D1 | D3 |
| 3 | -1 | 3 | -1 | -2.4 | -0.6316 | 1.1778 | 3.11 |
| 3 | -1 | 3 | 1 | -2.219 | -0.2667 | 1.4 | 3.2737 |
| 3 | -1 | 3 | 3 | -2.2 | -1.4743 | 0.9471 | 3.222 |
| 3 | 1 | -3 | -3 | -3.2462 | -1.352 | 0.6148 | 2.44 |
| 3 | 1 | -3 | -1 | -3.1333 | -1.1739 | 0.7892 | 2.5867 |

FIG. 4A

| | 302 | | | 322 | 324 | 326 |
|---|---|---|---|---|---|---|
| x1 | x2 | x4 | x5 | (D1+D-1)/2 | (D1+D3)/2 | (D1+D-3)/2 |
| 3 | -1 | 3 | -1 | 0.2731 | 2.1444 | -1.5158 |
| 3 | -1 | 3 | 1 | 0.56665 | 2.33685 | -1.24285 |
| 3 | -1 | 3 | 3 | -0.2636 | 2.08455 | -1.83715 |
| 3 | 1 | -3 | -3 | -0.3685 | 1.5274 | -2.2991 |
| 3 | 1 | -3 | -1 | -0.19235 | 1.68795 | -2.1536 |

FIG. 4B

MAXIMUM A POSTERIORI DETECTOR FOR LINEAR AND NONLINEAR CHANNEL IMPAIRMENT

CROSS-REFERENCE TO RELATED APPLICATION

This application claims benefit under 35 U.S.C. § 119(e) to U.S. Provisional Application No. 63/576,443, filed Mar. 16, 2023, entitled "MAXIMUM A POSTERIORI DETECTOR FOR LINEAR AND NONLINEAR CHANNEL IMPAIRMENT," the entire disclosure of which is hereby incorporated by reference herein.

FIELD

This disclosure relates generally to the field of photonic systems and more particularly relates to a maximum a posteriori (MAP) detector for both linear and nonlinear channel impairment.

BACKGROUND

Channel inter-symbol interference (ISI) due to narrow filtering or nonlinear distortion in a transmitter cannot be easily compensated by a linear equalizer. The transfer function of a linear equalizer can be optimized to minimize mean square error for a narrow-filtered signal. The linear equalizer generates enhanced noise at high frequency when equalizing narrow-filtered signal. A low-pass post filter can be added to suppress the enhanced noise but introduces ISI. Nonlinear distortion also can be attributed to the driver. A large voltage swing at the driver output can create a distorted constellation after a linear equalizer. Distortion can also occur in direct detection applications. The distortion can be attributed to the laser.

SUMMARY

In one embodiment, this disclosure provides a receiver to receive a plurality of symbols. The receiver comprises a hard decision decoder, a look-up table (LUT) coupled to the hard decision decoder, and a soft metric generator coupled to the LUT. The hard decision decoder is to receive a first set of symbols from the plurality of symbols and provide a set of hard coded neighboring symbols to the LUT. The first set of symbols comprises a center symbol with neighboring symbols. The LUT is to store a value representative of the center symbol that is addressable by the set of hard coded neighboring symbols. The soft metric generator is to calculate bit log likelihood ratio (LLR) values based on the center symbol and the value representative of the center symbol stored in the LUT.

In another embodiment, the receiver includes a post filter to receive the first set of symbols from the plurality of symbols and provide a second set of symbols to the soft metric generator. In another aspect, the post filter is to send the center symbol to the LUT to train the LUT.

In another embodiment, the first set of symbols comprises N symbols, wherein N is equal to 2L+1, wherein L is a number of symbols neighboring the center symbol on each side of the center symbol.

In another embodiment, the soft metric generator is to calculate soft information of the center symbol based on the LLR values.

In another embodiment, the value representative of the center symbol in the LUT comprises a first value, a second value, and a third value. The soft metric generator is to calculate the bit LLRs based on the value representative of the center symbol and the first, second, and third values in the LUT.

In another embodiment, the value representative of the center symbol is transmitted from the LUT to the soft metric generator.

In another embodiment, the hard decision decoder is to convert the first set of symbols from the plurality of symbols to the set of hard coded neighboring symbols by converting the set of hard coded neighboring symbols to integer representations.

In one embodiment, this disclosure provides a method of operating a receiver configured to receive a plurality of symbols. The method comprises receiving, by a hard decision decoder, a first set of symbols from the plurality of symbols, wherein the first set of symbols comprises a center symbol with neighboring symbols; hard coding, by the hard decision decoder, a set of hard coded neighboring symbols; providing, by the hard decision decoder, the set of hard coded neighboring symbols to a LUT; storing, in the LUT, a value representative of the center symbol that is addressable by the set of hard coded neighboring symbols; providing, by the LUT, a center symbol and a value representative of the center symbol stored in the LUT to a soft metric generator; and calculating, by the soft metric generator, LLR values based on the center symbol and the value representative of the center symbol received from the LUT.

In another embodiment the method further comprises receiving, by a post filter, the first set of symbols from the plurality of symbols; and providing, by the post filter, a second set of symbols.

In another embodiment of the method, the first set of symbols comprises N symbols, wherein N is equal to 2L+1, and wherein L is a number of symbols neighboring the center symbol.

In another embodiment the method further comprises calculating, by the soft metric generator, soft information of the center symbol based on the LLR values of the value representative of the center symbol.

In another embodiment of the method, the value representative of the center symbol in the LUT comprises a first value, a second value, and a third value, wherein each of the first value, second value, and third value is representative of the center symbol. The method further comprises calculating, by the soft metric generator, bit LLRs based on the value representative of the center symbol and the first, second and third values in the LUT.

In another embodiment the method further comprises training the LUT. Training the LUT comprises hard coding, by the hard decision decoder, the set of hard coded neighboring symbols to address the center symbol; selecting, by the soft metric generator, all candidates of the center symbol addressed by the set of hard coded neighboring symbols; calculating, by the soft metric generator, multiple values of the candidates of the center symbol based on average values of the candidates of the center symbols; and storing, by the soft metric generator, the multiple values of the candidates of the center symbol in the LUT; calculating, by the soft metric generator, soft information of the center symbol as bit LLR values based on the multiple values of the candidates of the center symbol stored in the LUT.

In another embodiment, the method further comprises converting, by the hard decision decoder, the first set of symbols from the plurality of symbols to the set of hard coded neighboring symbols by converting the set of hard coded neighboring symbols to integer representations.

In one embodiment, the present disclosure provides a system for processing a plurality of symbols. The system comprises a optical hybrid circuit, hard decision decoder coupled to the optical hybrid circuit, a LUT coupled to the hard decision decoder, and a soft metric generator coupled to the LUT. The optical hybrid circuit is to receive an optical signal and convert the optical signal to an electrical signal. The hard decision decoder is to receive a first set of symbols from the plurality of symbols. The first set of symbols comprises a center symbol with neighboring symbols and provide a set of hard coded neighboring symbols to the LUT. The LUT is to store a value representative of the center symbol that is addressable by the set of hard coded neighboring symbols. The soft metric generator is to calculate bit LLR values based on the center symbol and the value representative of the center symbol stored in the LUT.

In another embodiment, the system comprises a forward error correction (FEC) decoder coupled to the soft metric generator to receive a soft metric from the soft metric generator.

In another embodiment, the system comprises an optical to electrical converter circuit coupled to the optical hybrid circuit to convert the optical signal to an electrical signal and an analog to digital converter coupled to the optical to electrical converter circuit to convert the electrical signal to a digital signal defining a plurality of symbols based on a modulation scheme employed by a transmitter.

In another embodiment, the system comprises an adaptive equalizer to adapt to time varying properties of an optical channel coupled to the optical hybrid circuit.

In another embodiment, the system comprises a carrier recovery circuit to estimate and compensate for frequency and phase differences between a received signal carrier wave and a local oscillator of the system.

Although the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, passivation coatings/layers, optical paths, waveguides, splitters, couplers, combiners, electro-optical devices, inputs, outputs, ports, channels, components and parts of the foregoing disclosed herein can be used comprising laser, laser-based communication system, waveguide, fiber, transmitter, transceiver, receiver, and other devices and systems without limitation. These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which:

FIG. 4A is a LUT for a 1D MAP soft metric calculation for a pulse amplitude modulation 4-level (PAM4) signal modulation format, according to an exemplary embodiment of the disclosure. FIG. 4B is a simplified version of the LUT in FIG. 4A, according to an exemplary embodiment of the disclosure.

DETAILED DESCRIPTION

Figure 1:
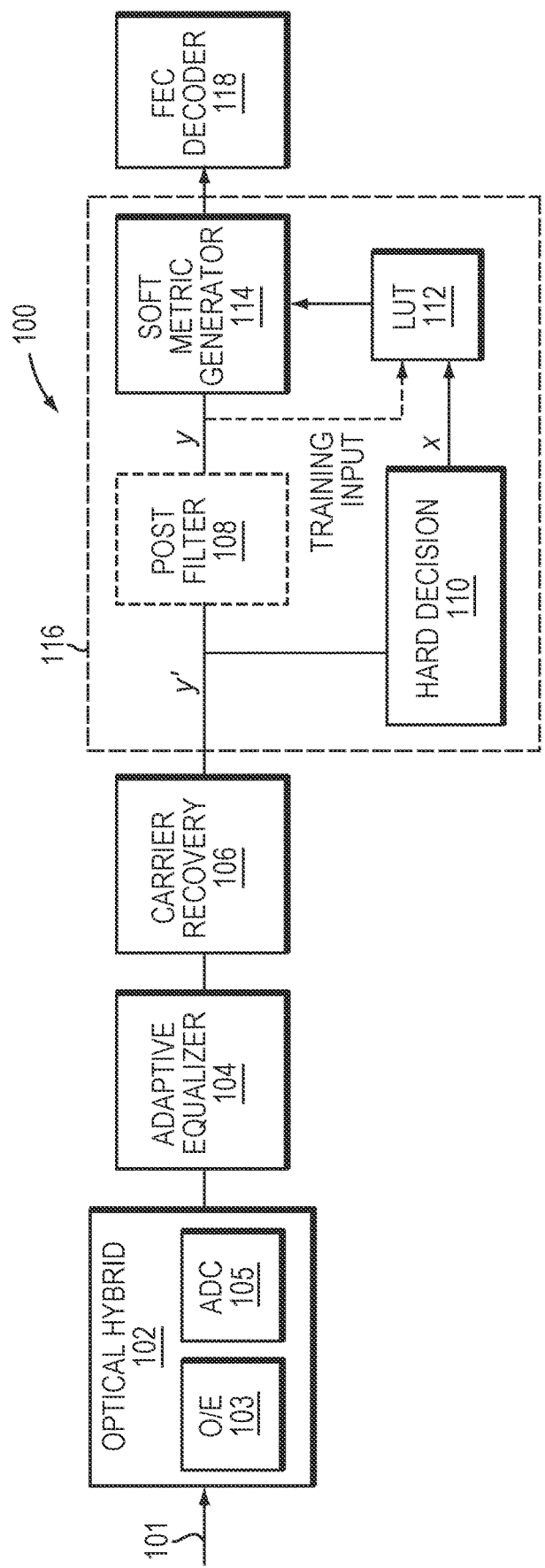
FIG. 1 is a receiver, according to an exemplary embodiment of the disclosure.

A sequence detector implemented either by a maximum likelihood sequence detector (MLSD) or MAP detector is necessary to correct ISI introduced by a low-pass post filter or nonlinear distortion attributed to the driver. But the complexity is prohibitively high to implement in a real-time coherent receiver. For example a MAP detector estimates transmitted symbols x given received symbol y according to Equation (1) below:

$$\mathrm{argmax}_x Pr(x|y) = \mathrm{argmax}_x \frac{Pr(y|x)Pr(x)}{Pr(y)} \quad (1)$$

One way of MAP implementation employs a look-up table (LUT). The LUT is trained by transmitting an ensemble of transmitted symbols {x} in according to a priori probability Pr(x) and get an averaged values of channel output as {D1,D2, . . . , Dm}, where Dj=<yj|x>, j=1,2, . . . m. Ideally, m shall be large enough to cover the channel memory. From now on, this will be referred to as mD-MAP if the LUT has m columns.

If the channel function is $[h_{-L}, h_{-L+1}, \ldots, 1, \ldots, h_{L-1}, h_L]$, then D1 and Dm are influenced by their 2L neighboring transmitted symbols each, thus there are total combinations of $N^{(2L+m)}$. N is the signal levels. N=2 for PAM2 and N=4 for PAM4. For example, a LUT size is $2^9 \times 5$ with values (D1,D2, . . . , D5) in each row can be created for an ISI channel according to Equation (2) below:

$$y(n) = x(n) + 0.2[x(n-1) + x(n+1)] + 0.1[x(n-2) + x(n+2)], x = \quad (2)$$

$$1, -1$$

A 5D-MAP LUT is shown in TABLE 1:

TABLE 1

|     | D1   | D2   | D3   | D4   | D5   |
|-----|------|------|------|------|------|
|     | −1.6 | −1.6 | −1.6 | −1.4 | −1.2 |
|     | −1.6 | −1.6 | −1.4 | −1.0 | 1.0  |
|     | −1.6 | −1.4 | −1.0 | 0.8  | 0.8  |
|     | −1.6 | −1.4 | −1.0 | 1.0  | 1.4  |
| 512 | −1.4 | −1.6 | −1.4 | −1.2 | 0.4  |
|     | −1.4 | −1.6 | −1.4 | −1.2 | 0.6  |
|     | −1.4 | −1.4 | −1.2 | 0.4  | −1.0 |
|     | −1.4 | −1.4 | −1.0 | 0.8  | 0.8  |
|     | −1.4 | −1.2 | 0.6  | −0.8 | 0.6  |
|     | ...  | ...  | ...  | ...  | ...  |

MAP requires an exhaustive search for the minimum Euclidean distance between the received signal and all the rows of the LUT, thus needs 512 calculations of distances according to Equation (3) below:

$$\mathrm{argmin}_D \|y - D\|^2 = \mathrm{argmin}_{\{D_1, D_2, D_3, D_4, D_5\}} \sum_{k=1}^{5} \|y_k - D_k\|^2 \quad (3)$$

The soft information of the center symbol can be calculated by bit LLR according to Equation (4) below:

$$LLR_{5DMAP}(b) = \ln \frac{Pr(b=0 \mid y)}{Pr(b=1 \mid y)} = \frac{1}{2\sigma^2} \min(|y - D|^2_{b=0}) - \frac{1}{2\sigma^2} \min(|y - D|^2_{b=1}) \quad (4)$$

To simplify the LUT size and the number of distance calculations, we create a LUT only for the center symbol D3, and use neighboring transmitted symbols {x1,x2,x4,x5} as a LUT address index. The number of neighboring symbols shall be large enough to cover the channel memory.

A 1D-MAP LUT is shown in TABLE 2:

TABLE 2

|    | x1 | x2 | x4 | x5 | D3   |
|----|----|----|----|----|------|
|    | −1 | −1 | −1 | −1 | −1.6 |
|    | −1 | −1 | −1 | 1  | −1.4 |
|    | −1 | −1 | 1  | −1 | −1.2 |
|    | −1 | −1 | 1  | 1  | −1   |
|    | −1 | −1 | −1 | −1 | 0.4  |
|    | −1 | −1 | −1 | 1  | 0.6  |
| 32 | −1 | −1 | 1  | −1 | 0.8  |
|    | −1 | −1 | 1  | 1  | 1    |
|    | −1 | 1  | −1 | −1 | −1.2 |
|    | −1 | 1  | −1 | 1  | −1   |
|    | −1 | 1  | 1  | −1 | −0.8 |
|    | −1 | 1  | 1  | 1  | −0.6 |
|    | −1 | 1  | −1 | −1 | 0.8  |
|    | ...| ...| ...| ...| ...  |

For the same channel in Equation (2), the LUT size is reduced to from 512 to 32 since m=1. We call it 1D-MAP. When implementing 1D-MAP, we need first hard coded neighboring symbols: y1→x1, y2→x2, y4→x4, y5→x5 and select one from two possible candidates D3(+) and D3(−) as shown in Equation (5) below:

$$\mathrm{argmin}_{D_3} \|r_3 - D_3\|^2 \quad (5)$$

For example, D3(+)=0.6 and D3(−)=−1.4 for neighboring symbol (−1,−1,−1,1) in the 1D-MAP LUT. The soft information of the center symbol can be calculated by LLR as shown in Equation (6) below:

$$LLR_{1DMAP}(b) = \ln \frac{Pr(b=0 \mid y)}{Pr(b=1 \mid y)} = \frac{1}{2\sigma^2} \min(|y - D|^2_{b=0}) - \frac{1}{2\sigma^2} \min(|y - D|^2_{b=1}) \quad (6)$$

Comparing the LLR value of 1D-MAP to the LLR value of regular symbol decision according to Equation (7):

$$LLR_{symbol}(b) = \ln \frac{Pr(b=0 \mid y)}{Pr(b=1 \mid y)} = \frac{1}{2\sigma^2}(|y+1|^2) - \frac{1}{2\sigma^2}(|y-1|^2) = \frac{2}{\sigma^2} y \quad (7)$$

As shown, the difference is that the boundary threshold is not fixed in 1D-MAP and depends on the neighboring symbols. Based on this proposition, the number of distance calculation can be reduced from 512 to 2. The complexity reduction can be even greater when the transmitted symbols has 4 levels.

TABLE 3 shows the LUT size and number of distance calculation between 1D-MAP, 5D-MAP and maximum likelihood sequence estimation (MLSE) with a Viterbi decoder.

TABLE 3

|             | PAM2 LUT           | PAM2 Distance | PAM4 LUT           | PAM4 Distance |
|-------------|--------------------|---------------|--------------------|---------------|
| 1D-MAP      | $2^{2L+1} \times 1$| 2             | $4^{2L+1} \times 1$| 4             |
| 5D-MAP      | $2^{2L+M} \times M$| $2^{2L+M}$    | $4^{2L+M} \times M$| $4^{2L+M}$    |
| MLSE-Viterbi|                    | $2^{2L+1}$    |                    | $4^{2L+1}$    |

In one general aspect, hard-coding neighboring symbols: y1→x1', y2→x2', y4→x4', y5→x5' according to at least one embodiment of the present disclosure significantly reduces the complexity of the design. In both linear and nonlinear ISI channels, the stored LUT value in the center symbol does not change much if there is only one symbol error in hard decision of the neighboring symbols as illustrated in TABLE 4:

TABLE 4

| x1 | x2 | x4 | x5 | D3   |
|----|----|----|----|------|
| −1 | −1 | −1 | −1 | −1.6 |
| −1 | −1 | −1 | 1  | −1.4 |
| −1 | 1  | −1 | −1 | −1.2 |
| 1  | −1 | −1 | −1 | −1.4 |
| −1 | −1 | 1  | −1 | −1.2 |

The MAP detector according to this disclosure significantly simplifies the complexity of a MAP detector with a small penalty. As previously discussed, MAP requires an exhaustive search for the minimum Euclidean distance between the received signal and all the rows of the LUT. in one embodiment, the MAP detector according to this disclosure provides a low power MAP detector that estimates transmitted symbols "x" given received symbol "y." In one embodiment, the MAP detector according to this disclosure provides a MAP detector employing a simplified LUT. In one embodiment, the LUT is simplified in both size and the number of distance calculations between the received signal and all the rows of the LUT. The simplified LUT is created only for the center symbol D3 and neighboring transmitted symbols {x1, x2, x4, x5} are employed as a LUT address index, where the number of neighboring symbols is large enough to cover the channel memory. In one embodiment, the LUT is trained by transmitting an ensemble of transmitted symbols {x} according to a priori probability Pr(x) to calculate averaged values of channel output.

Turning now to the figures, FIG. 1 is a receiver 100, according to an exemplary embodiment of the disclosure. The receiver 100 comprises an optical hybrid circuit 102, an adaptive equalizer 104, a carrier recovery circuit 106, a MAP detector 116, and a FEC decoder 118 to receive the soft metrics 128. The MAP detector 116 comprises a hard decision decoder 110, a soft metric generator 114, a LUT 112, and optionally a post filter 108. In one embodiment, the MAP detector 116 is a low power MAP detector.

The receiver 100 receives an optical signal 101 over an optical cable from a transmitter (not shown). The signal comprises a plurality of symbols. The optical hybrid circuit 102 comprises an optical to electrical converter circuit 103 to convert the received optical signal 101 to an electrical signal. The optical hybrid circuit 102 also comprises an analog to digital converter 105 to convert the electrical signal to a digital signal defining a plurality of symbols based on the modulation scheme employed by the transmitter. The adaptive equalizer 104 adapts to time varying properties of the optical channel. The carrier recovery circuit 106 estimates and compensates for frequency and phase differences between a received signal carrier wave and a local oscillator of the receiver. The MAP detector 116 receives the plurality of symbols, where the plurality of symbols comprises at least a first set of symbols. The first set of symbols is sent to the hard decision decoder 110. The FEC decoder 118 linearly decodes the soft metrics 128.

Figure 2:
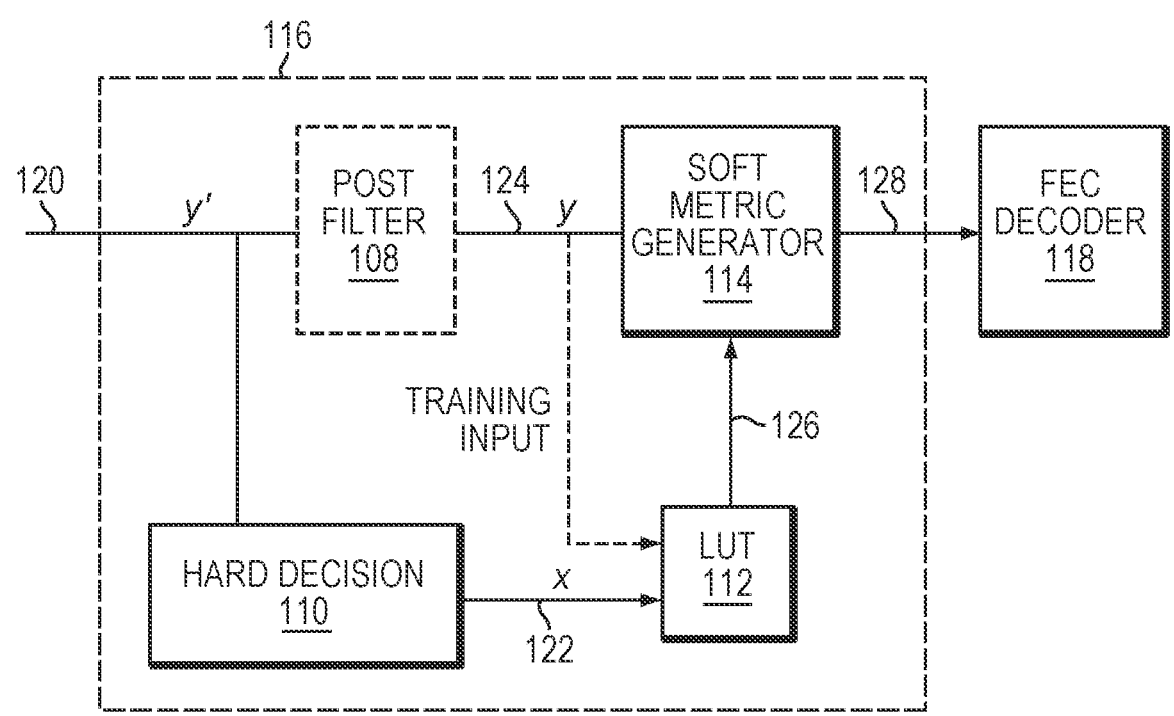
FIG. 2 is a MAP detector portion of the receiver shown in FIG. 1, according to an exemplary embodiment of the disclosure.

FIG. 2 is a detailed view of the MAP detector 116 shown in FIG. 1 according to an exemplary embodiment of the disclosure. The MAP detector 116 receives a plurality of symbols 120 {y'}. For example, the plurality of symbols 120 are {y1', y2', y3', . . . , yn'}, indicated as "y" in FIG. 2. The MAP detector 116 comprises a hard decision decoder 110, a LUT 112, and a soft metric generator 114. In some embodiments, the MAP detector 116 further comprises a post filter 108. Electrically connected to the MAP detector 116 is an FEC decoder 118. In one embodiment, the MAP detector 116 is a low power MAP detector.

The hard decision decoder 110 receives a first set of symbols from the plurality of symbols 120. The first set of symbols comprises a center symbol with neighboring symbols. In one embodiment, the first set of symbols comprises N symbols, where N is equal to 2L+1 and where L is the number of symbols neighboring the center symbol on each side of the center symbol. For example, the first set of symbols can comprise 5 symbols, where N=5. Thus, there are 4 neighboring symbols total, with 2 neighboring symbols on either side of the center symbol (L=2). For example, the first set of symbols are {y1', y2', y3', y4', y5'}, with y3' being the center symbol. The neighboring symbols are {y1', y2', y4', y5'}. Other values of N and L are permissible.

The hard decision decoder 110 provides a set of hard coded neighboring symbols 122 {x} to the LUT 112. For example, the hard coded neighboring symbols are {x1, x2, x4, x5}, indicated as 'x' in FIG. 2. The hard decision decoder 110 converts the first set of symbols from the plurality of symbols 120 to the set of hard coded neighboring symbols 122 {x} by converting the neighboring symbols to integer representations. For example, the hard decision decoder receives the first set of symbols, {y1', y2', y3', y4', y5'}. The hard decision decoder converts the neighboring symbols, {y1', y2', y4', y5'}, into integer representations, {x1, x2, x4, x5}. The integer representations are either −1 (logic 0) or 1 (logic 1) for a single bit Pam2 modulation format. The integer representations for two bits are −3 (logic 00), −1 (logic 01), 1 (logic 10), and 3 (logic 11), for a PAM4 modulation format.

The hard decision decoder 110 is coupled to the LUT 112. The LUT 112 stores at least one value representative of the center symbol that is addressable by the set of hard coded neighboring symbols 122 {x}. The hard decision decoder 110 sends the address to the LUT 112. The LUT 112 outputs the at least one value 126 representative of the center symbol and sends the at least one value 126 to the soft metric generator 114.

In one embodiment, the soft metric generator 114 receives the at least one value 126 from the LUT 112 and calculates bit LLR values based on the center symbol and the value representative of the center symbol stored in the LUT 112. In one embodiment, the soft metric generator 114 calculates soft information of the center symbol based on the LLR values. In one embodiment, the value representative of the center symbol in the LUT 112 comprises a first value, a second value, and a third value and the soft metric generator 114 calculates bit LLRs based on the value representative of the center symbol and the first, second and third values in the LUT 112. In one embodiment, the at least one value 126 representative of the center symbol is transmitted from the LUT 112 to the soft metric generator 114.

With reference now to both FIGS. 1 and 2, in one embodiment the receiver 100 comprises a post filter 108 configured to receive the first set of symbols from the plurality of symbols and provide a second set of symbols. In one embodiment, the post filter 108 filters the plurality of symbols 120 {y'} and sends the center symbol to the LUT 112 to train the LUT 112. Training the LUT 112 comprises hard coding the neighboring symbols to address the center symbol, selecting all candidates of the center symbol addressed by the set of hard coded neighboring symbols 122 {x}, calculating multiple values of the candidates of the center symbol based on average values of the candidates of the center symbols, storing the multiple values of the candidates of the center symbol in the LUT, and calculating soft information of the center symbol as bit LLR values based on the multiple values of the candidates of the center symbol stored in the LUT 112.

Figure 3A:
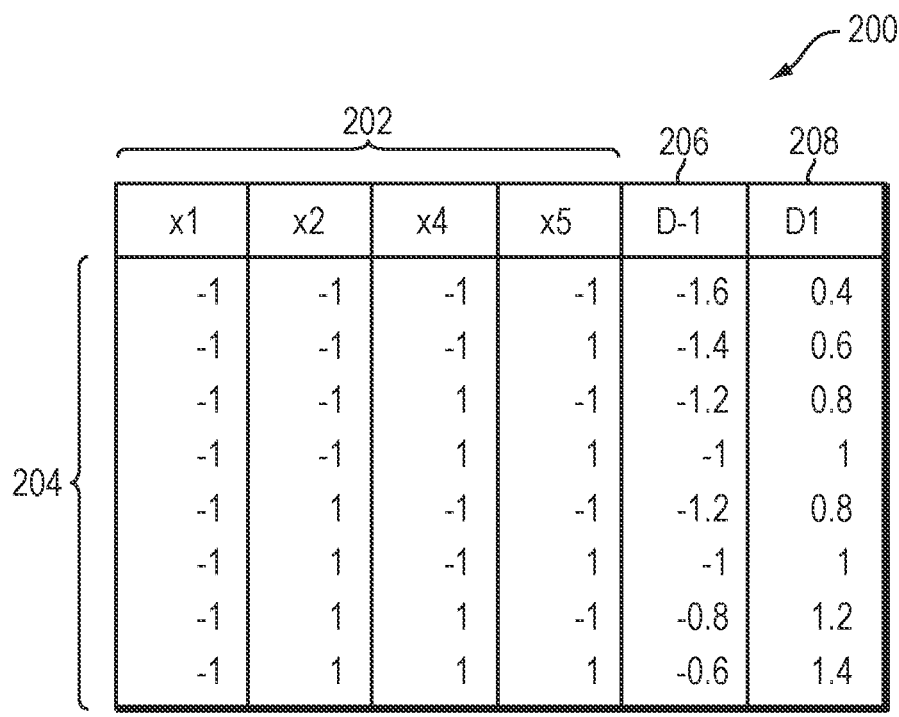
FIG. 3A is a LUT for a 1D MAP soft metric calculation for a pulse amplitude modulation 2-level (PAM2) signal modulation format, according to an exemplary embodiment of the disclosure.

FIG. 3A is a LUT 200 for a 1D MAP soft metric calculation for a PAM2 signal modulation format, according to an exemplary embodiment of the disclosure. In one embodiment, the LUT 200 is defined by a plurality of columns 202, 206, 208, a plurality of rows 204, and the values stored in the LUT 200. In the embodiment illustrated in FIG. 3A, the LUT 200 comprises $2^{2L}$ rows, where 2L is the channel memory. The first four columns 202 include neighboring transmitted symbols {x1,x2,x4,x5}, which are used as an address index for the LUT 200, where each neighboring transmitted symbol {x1,x2,x4,x5} is either −1 or 1. The addresses can have more or less neighboring transmitted symbols {x1,x2,x4,x5}. The LUT 200 is addressed by the address values stored in the first four columns 202 to find the values representative of the center symbol in columns 206, 208, where column 206 contains the candidate center symbol D−1 for center symbol −1 and the candidate center symbol D1 for center symbol 1.

With reference now to FIGS. 1 and 2 together with FIG. 3A, the LUT 200 is the LUT 112 portion of the hard decision decoder 110 of the MAP detector 116 for a one-bit scheme. The LUT 200 receives neighboring transmitted symbols {x1,x2,x4,x5} to address the values of D−1 and D1 stored in a corresponding row 204 of columns 206, 208. In the embodiment illustrated in FIG. 3A, for a one-bit scheme, the center symbol candidates for D−1 (−1) and D1 (1) are average values of the center symbol based on the neighboring transmitted symbol {x1,x2,x4,x5} in the first four columns 202. The D−1 and D1 values stored in the LUT 200 are used to calculate the average according to Equation (8) to generate the LUT 210 shown in FIG. 3B for use in the least likelihood ratio calculation by the soft metric generator 114 according to Equation (9):

$$A = \frac{D_1 + D_{-1}}{2} \quad (8)$$

$$LLR(b) = y - \frac{D_1 + D_{-1}}{2} \quad (9)$$

Figure 3B:
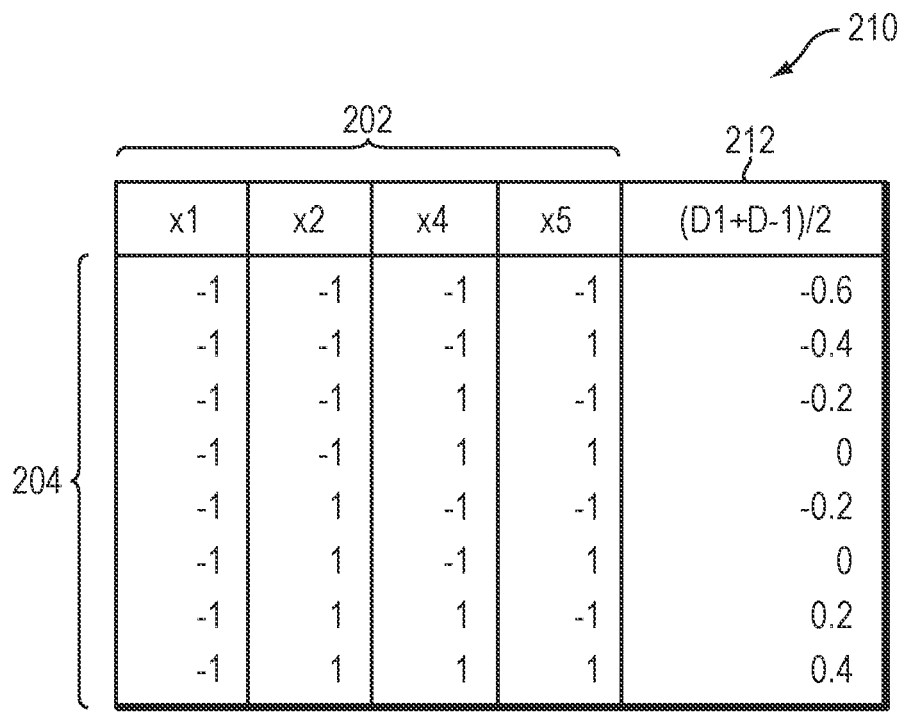
FIG. 3B is a simplified version of the LUT shown in in FIG. 3A, according to an exemplary embodiment of the disclosure.

Turning now to FIG. 3B, there is shown a simplified LUT 210 for a 1D MAP soft metric calculation for a PAM2 signal modulation format, according to an exemplary embodiment of the disclosure. In the embodiment illustrated in FIG. 3B, the simplified LUT 210 is a simplified version of the LUT 200 shown in FIG. 3A. The simplified LUT 210 includes a singular column 212 with rows 204 that are addressable by the neighboring transmitted symbols {x1,x2,x4,x5} in the first four columns 202. The singular column 212 stores the average value of the center symbol calculated according to Equation (8). In one embodiment, according to Equation (8), the at least one value representative of the center symbol is now expressed as an average of the two values D−1, D1 shown in columns 206, 208 in FIG. 3A.

With reference now to FIGS. 1 and 2 together with FIGS. 3A and 3B, the LUT 200, 210 receives the neighboring transmitted symbols {x1,x2,x4,x5} to address the average values of D−1 and D1 stored in a corresponding row 204 of columns 206, 208 or the singular column 212 and also receives filtered symbols 124 {y} from the post filter 108 or, in another embodiment, receives unfiltered received inputs {y'} directly from the carrier recovery circuit 106 for training the LUT 210. Training comprises hard coding the neighboring transmitted symbols {x1,x2,x4,x5} to address the candidate center symbol. The hard coded neighboring transmitted symbols {x1,x2,x4,x5} are the integer representations of the neighboring symbols. The address is the integer representations of the neighboring symbols stored in the first four columns 202. For each address, the element transmits symbols according to a priori probability. For example, the MAP detector sends a known set of symbols to determine the actual value of the center symbol. The MAP detector calculates the value of the center symbol.

Training also comprises selecting all center symbol candidates that are addressed by the set of hard coded neighboring transmitted symbols {x1,x2,x4,x5}. For example, as shown in FIG. 3B, the candidates of the center symbol for a one-bit scheme is −1 and 1. The center symbol D−1 in column 206 is the candidate for the center symbol when the center symbol is −1. The average value of the center symbol candidate is stored in the singular column 212 is transmitted to the LUT 210 via the training input. When the LUT 210 is not being trained, the training input is optional.

Training also comprises calculating multiple values of the candidates of the center symbol based on average values of the center symbol candidates. Training also comprises storing the multiple values of the center symbol candidates in the LUT 210. Storing the values of the center symbol candidates includes storing the average values calculated according to Equation (8) for each address in rows 204.

Training also comprises calculating soft information of the center symbol as bit LLR values according to Equation (9) based on the multiple values of the candidates of the center symbol stored in the LUT 210. In the one-bit scheme, the calculation of soft information is the subtraction of the value representative of the center symbol from the center symbol.

FIG. 4A is a LUT 300 for a 1D MAP soft metric calculation for a PAM4 signal modulation format, according to an exemplary embodiment of the disclosure. In one embodiment, the LUT 300 is defined by a plurality of columns 302, 306, 308, 310, 312, a plurality of rows 304, and the values stored in the LUT 300. In the embodiment illustrated in FIG. 4A, the LUT 300 comprises 42L rows, where 2L is the channel memory. The first four columns 302 include neighboring transmitted symbols {x1,x2,x4,x5}, which are used as an address index for the LUT 300, where each neighboring transmitted symbol {x1,x2,x4,x5} is either −3, −1, 1, or 3. The addresses can have more or less neighboring transmitted symbols {x1,x2,x4,x5}. The LUT 300 is addressed by the address values stored in the first four columns 302 to find the values representative of the center symbol in columns 306, 308, 310, 312, where column 306 contains the candidate center symbol D−3 for center symbol −3, column 308 contains the candidate center symbol D−1 for center symbol −1, column 310 contains the candidate center symbol D1 for center symbol 1, and column 312 contains the candidate center symbol D3 for center symbol 3.

With reference now to FIGS. 1 and 2 together with FIG. 4A, the LUT 300 is the LUT 112 portion of the hard decision decoder 110 of the MAP detector 116 for a two-bit scheme. The LUT 300 receives neighboring transmitted symbols {x1,x2,x4,x5} to address the values of D−3, D−1, D1, D3 stored in a corresponding row 304 of columns 306, 308, 310, 312. In the embodiment illustrated in FIG. 4A, for a two-bit scheme, the center symbol candidates for D−3 (−3), D−1 (−1), D1 (1), and D3 (3) are average values of the center symbol based on the neighboring transmitted symbol {x1, x2,x4,x5} in the first four columns 302. The D−3, D−1, D1, D3 values stored in the LUT 300 are used to calculate the average according to Equations (10), (11), and (12) to generate the LUT 320 shown in FIG. 4B for use in the least likelihood ratio calculation by the soft metric generator 114 according to Equations (13)-(14):

$$A = \frac{D_1 + D_{-1}}{2} \quad (10)$$

$$B = \frac{D_1 + D_3}{2} \quad (11)$$

$$C = \frac{D_{-1} + D_{-3}}{2} \quad (12)$$

$$L(b1) = y - \frac{D_1 + D_{-1}}{2} \quad (13)$$

$$L(b0) = \min\left[-y + \frac{D_1 + D_3}{2},\ y - \frac{D_{-1} + D_{-3}}{2}\right] \quad (14)$$

The LUT 300 is addressed by the addresses in the first four columns 302 to find the values representative of the center symbol. As shown, for a two-bit scheme, the center symbol candidates are −3, −1, 1, or 3. The center symbol D−3 in column 306 is the center symbol candidate when the center symbol is −3. The center symbol D−1 in column 308 is the center symbol candidate when the center symbol is −1. The center symbol D1 in column 310 is the center symbol candidate when the center symbol is 1. The center symbol D3 in column 312 is the center symbol candidate when the center symbol is 3. The values stored in a row for D−3 is the average value of the center symbol when the center symbol is −3 given the neighboring symbols. The values stored in a row for D−1 is the average value of the center symbol when the center symbol is −1 given the neighboring symbols. The values stored in a row for D1 is the average value of the center symbol when the center symbol is 1 given the neighboring symbols. The values stored in a row for D3 is the average value of the center symbol when the center symbol is 3 given the neighboring symbols.

Turning now to FIG. 4B, there is shown a simplified LUT 320 for a 1D MAP soft metric calculation for a PAM4 signal modulation format, according to an exemplary embodiment of the disclosure. In the embodiment illustrated in FIG. 4B, the simplified LUT 320 is a simplified version of the LUT 300 shown in FIG. 4A. The simplified LUT 320 includes three columns 322, 324, 326 that are addressable by addresses in rows 304. The columns 322, 324, 326 store the average value of the center symbol given the neighboring transmitted symbols {x1,x2,x4,x5} in the first four columns 302. The value representative of the center symbol is the average value of the center symbol calculated according to Equations (10)-(12). In one embodiment, according to Equations (10)-(12), the at least one value representative of the center symbol is now expressed as an average of two values shown in columns 322, 324, 326 in LUT 320. The first average value in column 322 is the average of D1 and D−1 calculated according to Equation (10). The second average value in column 324 is the average of D1 and D3 calculated according to Equation (11). The third average value in column 326 is the average of D−1 and D−3 calculated according to Equation (12).

Training the LUT 320 can be done in a similar manner as training the LUT 210 described in connection with FIG. 3B. Training the LUT 320 comprises calculating three values representative of the center symbol.

Turning back to FIGS. 1 and 2, the value representative of the center symbol is transmitted from the LUT 112 (e.g., LUTs 200, 210, 300, 320) to the soft metric generator 114. The soft metric generator 114 calculates bit LLR values based on the center symbol and the value representative of the center symbol stored in the LUT 112. The soft metric generator 114 calculates soft information of the center symbol based on the LLR values. The soft metric generator 114 calculates the soft information for the one-bit scheme by subtracting the value representative of the center symbol from the center symbol according to Equation (9). For the two-bit scheme, the soft metric generator 114 performs two calculations, one calculation for the first bit according to Equation (13) and a second calculation for the second bit according to Equation (14). The first bit calculation is the first value in column 322 subtracted from the center symbol. The second bit calculation is the minimum of either the second value in column 324 minus the center symbol or the center symbol minus the third value in column 326. The soft metric generator 114 is coupled to the FEC decoder 118 to receive the soft metrics 128 from the soft metric generator 114.

In one embodiment, the MAP detector 116 comprises a post filter 108. The post filter 108 receives a first set of symbols from a plurality of symbols 120 {y'} and transmits a second, filtered, set of symbols 124 {y} to the soft metric generator 114 and, if training, to the LUT 112.

Figure 5:
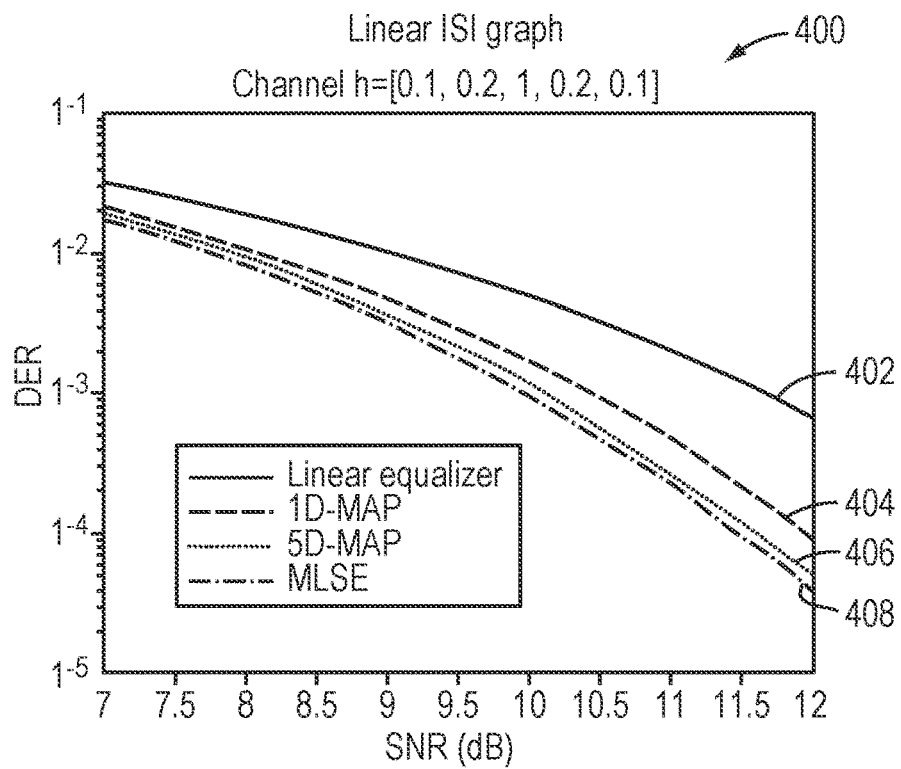
FIG. 5 is a linear ISI graph, according to an exemplary embodiment of the disclosure.

FIG. 5 is a linear ISI graph 400. The linear ISI graph 400 shows that the linear equalizer 402 provides the highest signal to noise ratio (SNR) vs bit error rate (BER). The MLSE 408 has the lowest SNR vs the BER. The graph also shows there is minimal difference between the SNR and BER between MLSE 408, a 5D-MAP 406, and a 1D-MAP 404. The 1D-MAP 404 is most align with the disclosure herein.

Figure 6:
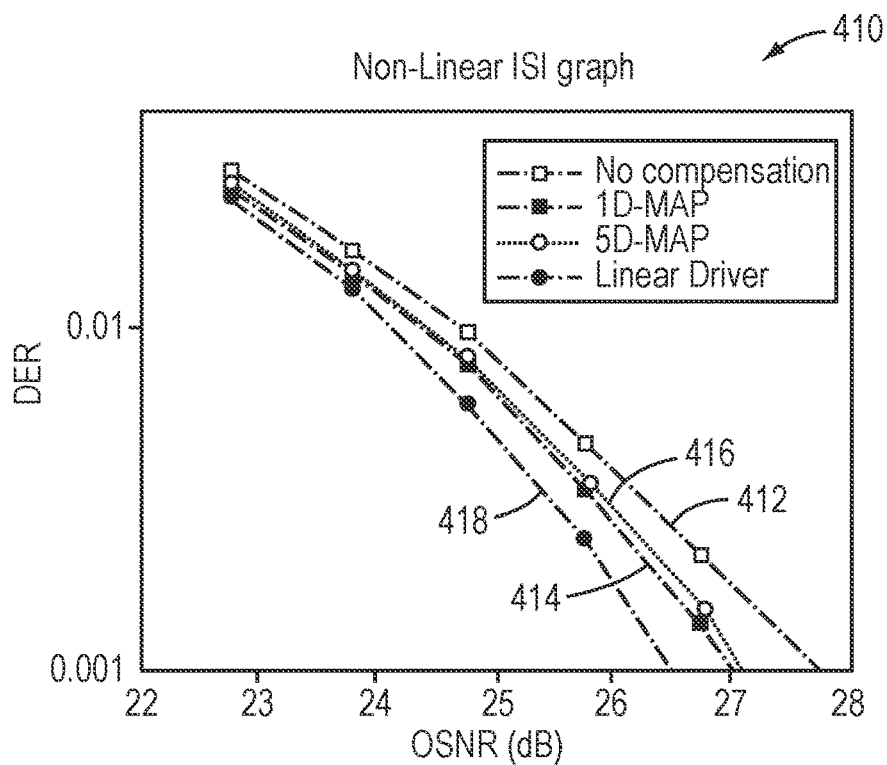
FIG. 6 is a non-linear ISI graph, according to an exemplary embodiment of the disclosure.

FIG. 6 is a non-linear ISI graph 410. The non-linear ISI graph 410 shows that the 1D-MAP 414 and the 5D-MAP 416 have almost an identical optical SNR (OSNR) vs BER. The 1D-MAP 414 and 5D-MAP 416 also have a better ratio than when no compensation 412 is done. The linear driver 418 provides the best ratio of OSNR vs BER.

Figure 7:
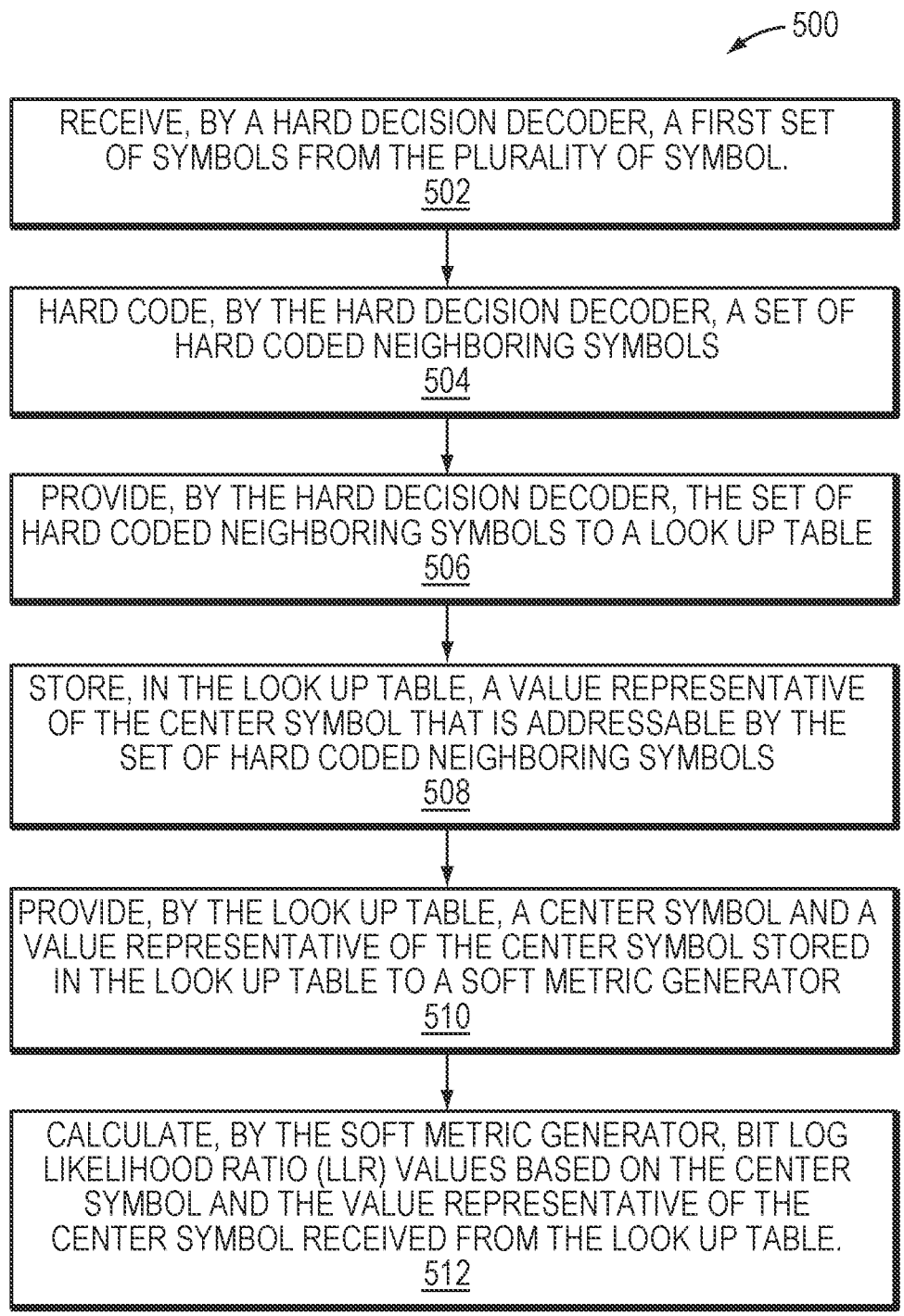
FIG. 7 is a logic flow diagram of a method of operating a receiver configured to receive a plurality of symbols, according to an exemplary embodiment of the disclosure.

FIG. 7 is a logic flow diagram of a method 500 of operating a receiver configured to receive a plurality of symbols, according to an exemplary embodiment of the disclosure. With reference to FIGS. 1 and 2 together with FIG. 7, in one embodiment a hard decision decoder 110 receives 502 a first set of symbols from the plurality of symbols 120. The first set of symbols comprises a center symbol with neighboring symbols. In one embodiment, the first set of symbols comprises N symbols, wherein N is equal to 2L+1, and wherein L is a number of symbols neighboring the center symbol. The hard decision decoder 110 hard code 504 a set of hard coded neighboring symbols. The hard decision decoder 110 provides 506 the set of hard coded neighboring symbols to a LUT 112. The LUT 112 stores 508 a value representative of the center symbol that is addressable by the set of hard coded neighboring symbols. The LUT 112 provides 510 a center symbol and a value representative of the center symbol stored in the LUT 112 to a soft metric generator 114. The soft metric generator 114 calculates bit LLR values based on the center symbol and the value representative of the center symbol received from the LUT 112.

In one embodiment, according to the method 500 the hard decision decoder 110 converts the first set of symbols from the plurality of symbols 120 {y'} to the set of hard coded neighboring symbols 122 {x} by converting the hard coded neighboring symbols 122 {x} to integer representations.

In one embodiment, according to the method 500, the post filter 108 receives the first set of symbols from the plurality of symbols 120 (y') and provides a second set of symbols 124 {y} to the soft metric generator 114 and, in some embodiments, provides the second set of symbols 124 {y} to the LUT 112. In one embodiment, according to the method 500, the soft metric generator 114 calculates soft information of the center symbol based on the LLR values of the value representative of the center symbol received from the LUT 112 and the second set of symbols 124 {y} received from the post filter 108.

In one embodiment, the value representative of the center symbol in the LUT 112 comprises a first value, a second value, and a third value representative of the center symbol. According to the method 500, the soft metric generator 114 calculates bit LLRs based on the value representative of the center symbol and the first, second and third values in the LUT.

In one embodiment, the method 500 comprises training the LUT 112. According to the method 500, the hard decision decoder 110 generates the hard coded neighboring symbols 122 {x} to address the center symbol in the LUT 112. The soft metric generator 114 selects candidates of the center symbol addressed by the set of hard coded neighboring symbols 122 {x}. The soft metric generator 114 calculates multiple values of the candidates of the center symbol based on average values of the candidates of the center symbols. The soft metric generator 114 stores the multiple values of the candidates of the center symbol in the LUT 112. The soft metric generator 114 calculates the soft information of the center symbol as bit LLR values based on the multiple values of the candidates of the center symbol stored in the LUT 112.

In one embodiment, the method of FIG. 7 and the hard decision decoder of FIGS. 1 and 2 can be used for direct detection applications such as direct detection receivers. For example, direct detection receivers may be a PAM4 receiver. The disclosed method can be used for nonlinearity compensation in direct detection. The method can correct data dependent non-linearity introduced in the transmitter by the laser.

In general, the method includes making a tentative decision of pre/post symbols to create four correction terms on the current symbol, one term for each potential decision of PAM4. The correction terms are adaptive and converge over time using the adaptation logic. The method calculates slicer error for every PAM4 decision based on the corresponding correction term. The output is the symbol with minimum slicer error after the non-linear (NL) correction term.

Figure 8:
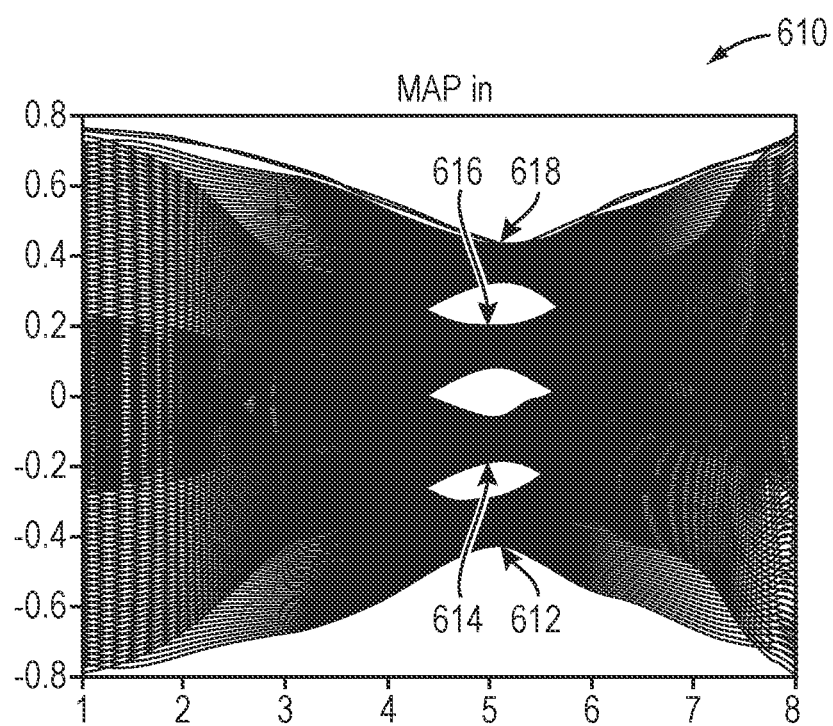
FIG. 8 illustrates a graph of the input to a PAM4 receiver, according to an aspect of this disclosure.

FIG. 8 illustrates a graph of the input to a PAM4 receiver, according to an aspect of this disclosure. The PAM4 graph 610 illustrates the four levels, D−3 (−3) 612, D−1 (−1) 614, D1 (1) 616, and D3 (3) 618. As shown, the four levels −3, −1, 1, 3 are distorted and not in line. The distortion is caused by the nonlinearity of the laser.

Figure 9:
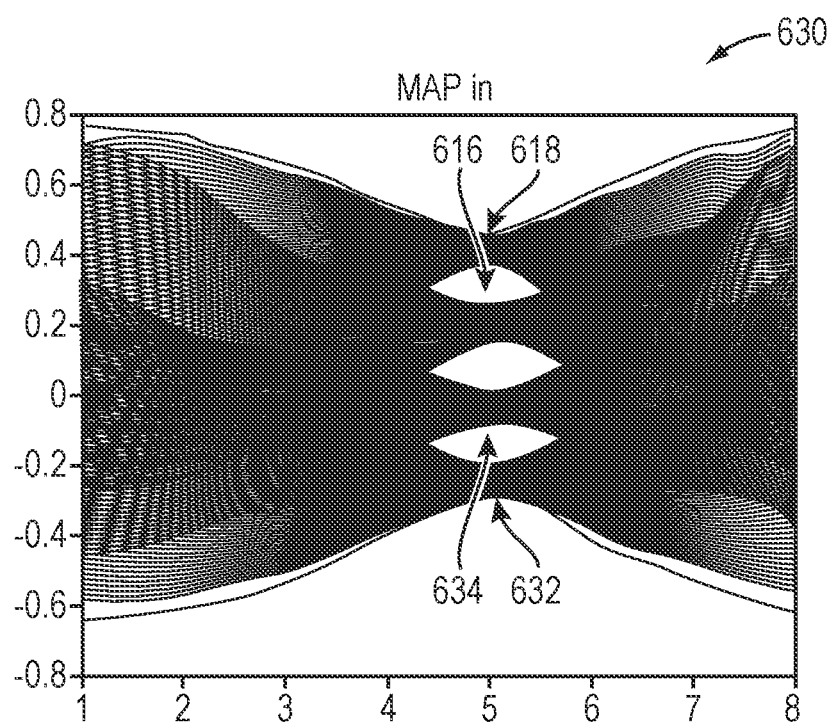
FIG. 9 illustrates a graph of the corrected output from the PAM4 receiver, according to an aspect of this disclosure.

FIG. 9 illustrates a graph 630 of the corrected output from the PAM4 receiver, according to an aspect of this disclosure. As shown, there is no distortion to the levels, D−3 (−3) 632, D−1 (−1) 634, D1 (1) 636, and D3 (3) 638. The levels are in line. The disclosed method remedies the distortion at the input to the receiver by outputting non-distorted signals.

Figure 10:
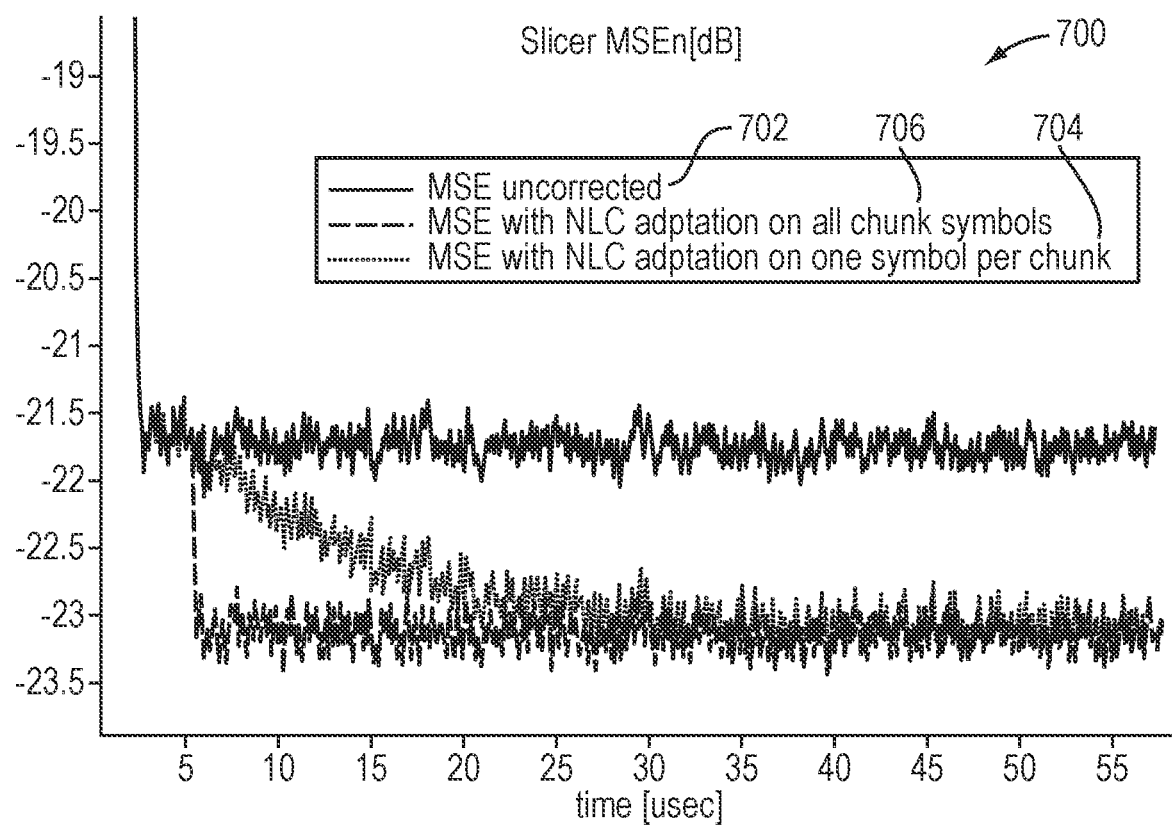
FIG. 10 illustrates a graph of the means squared error with and without correction, according to an aspect of the disclosure.

FIG. 10 illustrates a graph of the means squared error with and without correction, according to an aspect of the disclosure. The graph 700 shows improvement of MSE with correction, from the uncorrected MSE 702 to the MSE with non-linear correction (NLC) adaptation using all symbols per clock cycle 706. The graph 700 shows 2 dB of improvement from the uncorrected MSE 702 to the MSE with NLC adaptation on all symbols 706. The MSE without correction 702 has a higher MSE. The means squared error with NLC adaption on all chunk symbols 706 has lowest MSE. To save power consumption, we can use only 1 symbol per clock cycle to adaptively train LUT. The means squared error with NLC adaptation on one symbol per clock cycle 704 converges to the MSE with NLC adaptation on all symbols 706.

Having thus described several aspects and embodiments of the technology of this application, it is to be appreciated that various alterations, modifications, and improvements will readily occur to those of ordinary skill in the art. Such alterations, modifications, and improvements are intended to be within the scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

In most embodiments, a processor may be a physical or virtual processor. In other embodiments, a virtual processor may be spread across one or more portions of one or more physical processors. In certain embodiments, one or more of the embodiments described herein may be embodied in hardware such as a Digital Signal Processor (DSP). In certain embodiments, one or more of the embodiments herein may be executed on a DSP. One or more of the embodiments herein may be programmed into a DSP. In some embodiments, a DSP may have one or more processors and one or more memories. In certain embodiments, a DSP may have one or more computer readable storages. In many embodiments, a DSP may be a custom designed ASIC chip. In other embodiments, one or more of the embodiments stored on a computer readable medium may be loaded into a processor and executed.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112(f). Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

What is claimed is:

1. A receiver configured to receive a plurality of symbols, the receiver comprising:
    a hard decision decoder;
    a look-up table (LUT) coupled to the hard decision decoder; and
    a soft metric generator coupled to the LUT;
    wherein the hard decision decoder is configured to:
        receive a first set of symbols from the plurality of symbols, wherein the first set of symbols comprises a center symbol with neighboring symbols; and
        provide a set of hard coded neighboring symbols to the LUT, wherein the LUT is configured to store a value representative of the center symbol that is addressable by the set of hard coded neighboring symbols; and
    wherein the soft metric generator is configured to calculate bit log likelihood ratio (LLR) values based on the center symbol and the value representative of the center symbol stored in the LUT.

2. The receiver of claim 1, comprising a post filter configured to receive the first set of symbols from the plurality of symbols and provide a second set of symbols to the soft metric generator.

3. The receiver of claim 2, wherein the post filter is configured to send the center symbol to the LUT to train the LUT.

4. The receiver of claim 1, wherein the first set of symbols comprises N symbols, wherein N is equal to 2L+1, wherein L is a number of symbols neighboring the center symbol on each side of the center symbol.

5. The receiver of claim 1, wherein the soft metric generator is configured to calculate soft information of the center symbol based on the LLR values.

6. The receiver of claim 1, wherein the value representative of the center symbol in the LUT comprises a first value, a second value, and a third value, wherein the soft metric generator is configured to calculate bit LLRs based on the value representative of the center symbol and the first, second, and third values in the LUT.

7. The receiver of claim 1, wherein the value representative of the center symbol is transmitted from the LUT to the soft metric generator.

8. The receiver of claim 1, wherein the hard decision decoder is configured to convert the first set of symbols from the plurality of symbols to the set of hard coded neighboring symbols by converting the set of hard coded neighboring symbols to integer representations.

9. A method of operating a receiver to receive a plurality of symbols, the method comprising:
    receiving, by a hard decision decoder, a first set of symbols from the plurality of symbols, wherein the first set of symbols comprises a center symbol with neighboring symbols;
    hard coding, by the hard decision decoder, a set of hard coded neighboring symbols;
    providing, by the hard decision decoder, the set of hard coded neighboring symbols to a look-up table (LUT);
    storing, in the LUT, a value representative of the center symbol that is addressable by the set of hard coded neighboring symbols;
    providing, by the LUT, a center symbol and a value representative of the center symbol stored in the LUT to a soft metric generator; and
    calculating, by the soft metric generator, bit log likelihood ratio (LLR) values based on the center symbol and the value representative of the center symbol received from the LUT.

10. The method of claim 9, further comprising:
    receiving, by a post filter, the first set of symbols from the plurality of symbols; and
    providing, by the post filter, a second set of symbols.

11. The method of claim 9, wherein the first set of symbols comprises N symbols, wherein N is equal to 2L+1, and wherein L is a number of symbols neighboring the center symbol.

12. The method of claim 9, further comprising calculating, by the soft metric generator, soft information of the center symbol based on the LLR values of the value representative of the center symbol.

13. The method of claim 10, wherein the value representative of the center symbol in the LUT comprises a first value, a second value, and a third value, wherein each of the first value, second value, and third value is representative of the center symbol, and wherein the method further comprises:
    calculating, by the soft metric generator, bit LLRs based on the value representative of the center symbol and the first, second, and third values in the LUT.

14. The method of claim 9, further comprising training the LUT, wherein training the LUT comprises:
    hard coding, by the hard decision decoder, the set of hard coded neighboring symbols to address the center symbol;
    selecting, by the soft metric generator, all candidates of the center symbol addressed by the set of hard coded neighboring symbols;
    calculating, by the soft metric generator, multiple values of the candidates of the center symbol based on average values of the candidates of the center symbol;
    storing, by the soft metric generator, the multiple values of the candidates of the center symbol in the LUT; and
    calculating, by the soft metric generator, soft information of the center symbol as bit LLR values based on the multiple values of the candidates of the center symbol stored in the LUT.

15. The method of claim 9, further comprising converting, by the hard decision decoder, the first set of symbols from the plurality of symbols to the set of hard coded neighboring symbols by converting the set of hard coded neighboring symbols to integer representations.

16. A system for processing a plurality of symbols, the system comprising:
- an optical hybrid circuit,
- a hard decision decoder coupled to the optical hybrid circuit;
- a look-up table (LUT) coupled to the hard decision decoder; and
- a soft metric generator coupled to the LUT;
- wherein the optical hybrid circuit is configured to receive an optical signal and convert the optical signal to an electrical signal;
- wherein the hard decision decoder is configured to:
  - receive a first set of symbols from the plurality of symbols, wherein the first set of symbols comprises a center symbol with neighboring symbols; and
  - provide a set of hard coded neighboring symbols to the LUT, wherein the LUT is configured to store a value representative of the center symbol that is addressable by the set of hard coded neighboring symbols; and
- wherein the soft metric generator is configured to calculate bit log likelihood ratio (LLR) values based on the center symbol and the value representative of the center symbol stored in the LUT.

17. The system of claim 16, comprising a forward error correction (FEC) decoder coupled to the soft metric generator to receive a soft metric from the soft metric generator.

18. The system of claim 16, comprising:
- an optical to electrical converter circuit coupled to the optical hybrid circuit to convert the optical signal to an electrical signal; and
- an analog to digital converter coupled to the optical to electrical converter circuit to convert the electrical signal to a digital signal defining a plurality of symbols based on a modulation scheme employed by a transmitter.

19. The system of claim 16, comprising an adaptive equalizer configured to adapt to time varying properties of an optical channel coupled to the optical hybrid circuit.

20. The system of claim 19 comprising a carrier recovery circuit configured to estimate and compensate for frequency and phase differences between a received signal carrier wave and a local oscillator of the system.

* * * * *